United States Patent
Zhao et al.

(10) Patent No.: US 11,176,878 B2
(45) Date of Patent: Nov. 16, 2021

(54) FLEXIBLE DISPLAY SCREEN, BENDING DETECTION METHOD AND DEVICE, DISPLAY DEVICE

(71) Applicant: BOE TECHNOLOGY GROUP CO., LTD., Beijing (CN)

(72) Inventors: Detao Zhao, Beijing (CN); Lei Wang, Beijing (CN); Ming Yang, Beijing (CN); Can Wang, Beijing (CN); Ning Cong, Beijing (CN); Han Yue, Beijing (CN); Can Zhang, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/606,128

(22) PCT Filed: May 14, 2019

(86) PCT No.: PCT/CN2019/086897
§ 371 (c)(1),
(2) Date: Oct. 17, 2019

(87) PCT Pub. No.: WO2019/228184
PCT Pub. Date: Dec. 5, 2019

(65) Prior Publication Data
US 2020/0243004 A1 Jul. 30, 2020

(30) Foreign Application Priority Data

May 31, 2018 (CN) .......................... 201810550006.4

(51) Int. Cl.
*G09G 3/32* (2016.01)
*G09G 3/3225* (2016.01)
(Continued)

(52) U.S. Cl.
CPC ......... *G09G 3/3225* (2013.01); *G06F 1/1652* (2013.01); *G09G 3/035* (2020.08);
(Continued)

(58) Field of Classification Search
CPC .... G09G 3/3225; G09G 3/006; G09G 3/3233; G09G 3/035; G09G 2300/0426;
(Continued)

(56) References Cited

U.S. PATENT DOCUMENTS 10,216,025 B2 2/2019 Wang et al.
10,558,289 B2 2/2020 Wang et al.
(Continued)

FOREIGN PATENT DOCUMENTS

CN 105446616 A 3/2016
CN 106248504 A 12/2016
(Continued)

*Primary Examiner* — Liliana Cerullo
(74) *Attorney, Agent, or Firm* — Westman, Champlin & Koehler, P.A.

(57) ABSTRACT

A flexible display screen, a bending detection method and device, a driving method are disclosed. The flexible display screen includes an array substrate, a light emitting device on a side of the array substrate, and an elastic conductor layer on a side of the array substrate distal to the light emitting device. The array substrate includes at least one target region, and a plurality of storage capacitors in each target region. The array substrate further includes a target electrode-plate including first electrode-plates of storage capacitors in the same target region. The target electrode-plate is electrically connected to a detecting signal terminal, and the detecting electrode-plate includes at least the target electrode-plate. The array substrate is configured to form a bending detection capacitor collectively by the detecting electrode-plate and the elastic conductor layer in response to the target electrode-plate receives detecting signal.

19 Claims, 14 Drawing Sheets

(51) Int. Cl.
*G06F 1/16* (2006.01)
*G09G 3/00* (2006.01)

(52) U.S. Cl.
CPC ........... *G09G 2300/0426* (2013.01); *G09G 2320/0626* (2013.01); *G09G 2380/02* (2013.01)

(58) Field of Classification Search
CPC ... G09G 2300/0842; G09G 2320/0626; G09G 2320/0295; G09G 2380/02; G09F 9/30; G06F 1/1652
See application file for complete search history.

(56) References Cited

U.S. PATENT DOCUMENTS

| | | | |
|---|---|---|---|
| 2015/0116608 A1* | 4/2015 | Jeong | G06F 3/0446 349/12 |
| 2015/0228704 A1* | 8/2015 | Miyake | H01L 24/50 257/40 |
| 2017/0097721 A1* | 4/2017 | Wang | G06F 3/04166 |
| 2017/0168643 A1 | 6/2017 | Wang et al. | |
| 2018/0088629 A1 | 3/2018 | Kim | |
| 2018/0120615 A1 | 5/2018 | Wang et al. | |
| 2020/0012367 A1* | 1/2020 | Seo | G06F 3/04166 |

FOREIGN PATENT DOCUMENTS

| | | |
|---|---|---|
| CN | 106445267 A | 2/2017 |
| CN | 106873814 A | 6/2017 |
| JP | 2009058793 A | 3/2009 |

* cited by examiner

FLEXIBLE DISPLAY SCREEN, BENDING DETECTION METHOD AND DEVICE, DISPLAY DEVICE

CROSS-REFERENCE TO RELATED APPLICATION

This application is a Section 371 National Stage Application of International Application No. PCT/CN2019/086897, filed on May 14, 2019, entitled "FLEXIBLE DISPLAY SCREEN, BENDING DETECTION METHOD AND DEVICE, DISPLAY DEVICE", which claims the benefit of Chinese Patent Application No. 201810550006.4 filed on May 31, 2018, the disclosures of which are incorporated herein by reference.

TECHNICAL FIELD

The present disclosure relates to a flexible display screen, a bending detection method, a bending detection device, and a driving method.

BACKGROUND

An organic light-emitting diode (abbreviated as OLED) device is more and more widely applied in high-performance display products as a current-type light-emitting device since it has characteristics such as low power consumption, self-luminescence, fast response, and large visual angle.

SUMMARY

In an aspect, a flexible display screen is provided, including: an array substrate including at least one target region, the array substrate further including: a plurality of storage capacitors in each target region, each of the storage capacitors including a first electrode-plate; a detecting signal terminal; and a detecting electrode-plate; a light emitting device on a side of the array substrate; and an elastic conductor layer on a side of the array substrate distal to the light emitting device, wherein the array substrate further includes a target electrode-plate, the target electrode-plate includes a plurality of first electrode-plates of the plurality of storage capacitors in the same target region, the target electrode-plate is electrically connected to the detecting signal terminal, and the detecting electrode-plate includes at least the target electrode-plate; and the array substrate is configured to form a bending detection capacitor collectively by the detecting electrode-plate and the elastic conductor layer in response to that the target electrode-plate receives a detecting signal from the detecting signal terminal.

Optionally, each of the storage capacitors further includes a second electrode-plate, and the second electrode-plate is opposite to and spaced apart from the first electrode-plate, and the array substrate further includes a switching circuit, and the switching circuit is configured to control the first electrode-plate and the second electrode-plate to be in one of a connection state or a disconnection state in response to that the target electrode-plate receives the detecting signal from the detecting signal terminal.

Optionally, an orthographic projection of the first electrode-plate on the elastic conductor layer covers an orthographic projection of the second electrode-plate on the elastic conductor layer; and the switching circuit is configured to control the first electrode-plate and the second electrode-plate to be in the disconnection state in response to that the target electrode-plate receives the detecting signal from the detecting signal terminal, so that the target electrode-plate constitutes the detecting electrode-plate.

Optionally, the switching circuit is configured to control the first electrode-plate and the second electrode-plate to be in the connection state in response to that the target electrode-plate receives the detecting signal from the detecting signal terminal, so that the target electrode-plate together with second electrode-plates of the plurality of storage capacitors in the same target region constitute the detecting electrode-plate.

Optionally, the array substrate further includes a switching signal terminal; the switching circuit includes a first switching transistor, the first switching transistor including a gate electrode, a first electrode and a second electrode; the gate electrode of the first switching transistor is electrically connected to the switching signal terminal, the first electrode of the first switching transistor is electrically connected to the first electrode-plate, and the second electrode of the first switching transistor is electrically connected to the second electrode-plate; and the switching circuit is configured to control the first electrode-plate and the second electrode-plate to be in one of the connection state or the disconnection state under control of a switching signal from the switching signal terminal in response to that the target electrode-plate receives the detecting signal.

Optionally, the array substrate further includes a display driving circuit, a power signal terminal, a gate line and a data line, the display driving circuit includes the storage capacitors, the first electrode-plate is electrically connected to the power signal terminal, and the display driving circuit is electrically connected to the gate line and the data line, respectively; and the display driving circuit is configured to receive a power signal through the first electrode-plate, charge a respective one of the storage capacitors through a data signal from the data line under an action of the power signal and a gate driving signal from the gate line, and supply the power signal to the light emitting device under control of a voltage of the respective one the storage capacitors.

Optionally, the display driving circuit further includes a first driving transistor and a second switching transistor, the first driving transistor including a gate electrode, a first electrode and a second electrode, the second switching transistor including a gate electrode, a first electrode and a second electrode; the gate electrode of the first driving transistor is electrically connected to the second electrode-plate, the first electrode of the first driving transistor is electrically connected to the first electrode-plate, and the second electrode of the first driving transistor is electrically connected to the light emitting device; and the gate electrode of the second switching transistor is electrically connected to the gate line, the first electrode of the second switching transistor is electrically connected to the data line, and the second electrode of the second switching transistor is electrically connected to the gate electrode of the first driving transistor.

Optionally, the array substrate includes a plurality of the target regions, the plurality of the target regions have the same shape as one another and an area equal to one another, and the shape of the target region is a rectangle.

Optionally, the elastic conductor layer includes a thin film elastomer layer and a thin film conductor layer which are sequentially disposed in a direction distal to the array substrate, and the thin film elastomer layer is an insulating layer.

Optionally, the thin film conductor layer is grounded.

Optionally, the detecting signal is a touch signal, and the bending detection capacitor is a touch sensing capacitor.

Optionally, the thin film elastomer layer is made of a silicone rubber material, and the thin film conductor layer is made of indium tin oxide.

Optionally, the flexible display screen further includes a flexible substrate on a side of the elastic conductor layer distal to the array substrate.

Optionally, the flexible substrate is made of polycarbonate material.

In another aspect, a bending detection method for the flexible display screen of any one of paragraphs of the above aspect is provided, including:

acquiring a target detection capacitance value corresponding to a first target region in response to that the target electrode-plate in the first target region receives the detecting signal, wherein the target detection capacitance value corresponding to the first target region is a capacitance value of the bending detection capacitor formed collectively by the detecting electrode-plate and the elastic conductor layer in the first target region, and the first target region is any of the at least one target region; and determining bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state.

Optionally, the determining bending information of the first target region according to a difference between the target detection capacitance value corresponding to the first target region and an initial detection capacitance value corresponding to the first target region includes:

detecting whether the difference satisfies a target condition; and determining the bending information of the first target region in response to that the difference satisfies the target condition, wherein the bending information includes at least one of bending indication information, a bending degree or a bending direction, and the bending indication information indicates bending.

In a further aspect, a bending detection device for the flexible display screen of any one of paragraphs of the above aspect, including:

an acquiring module configured to acquire a target detection capacitance value corresponding to a first target region in response to that the target electrode-plate in the first target region receives the detecting signal, wherein the target detection capacitance value corresponding to the first target region is a capacitance value of the bending detection capacitor formed collectively by the detecting electrode-plate and the elastic conductor layer in the first target region, and the first target region is any of the at least one target region; and a determining module configured to determine bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state.

Optionally, the determining module is configured to: detect whether the difference between the target detection capacitance value corresponding to the first target region and the initial detection capacitance value satisfies a target condition; and determine the bending information of the first target region when the difference between the target detection capacitance value corresponding to the first target region and the initial detection capacitance value satisfies the target condition, wherein the bending information includes at least one of bending indication information, a bending degree or a bending direction, and the bending indication information indicates a bending.

In a still further aspect, a bending detection device including a processor and a memory is provided, wherein the memory is configured to store a computer program; and the processor is configured to execute the program stored in the memory so as to implement the bending detection method of any one of paragraphs of the above aspect.

In another further aspect, a storage medium is provided, wherein the bending detection method of any one of paragraphs of the above aspect is implemented when a program in the storage medium is executed by a processor.

In still another further aspect, a display device is provided, including a flexible display screen and a bending detection device, wherein the flexible display screen is the flexible display screen of any one of paragraphs of the above aspect, the bending detection device is the bending detection device of any one of paragraphs of the above further aspect, or the bending detection device is the bending detection device of paragraphs of the above still further aspect.

In still another further aspect, a driving method for the flexible display screen of any one of paragraphs of the above aspect is provided. The driving method includes:

acquiring a target detection capacitance value corresponding to a first target region in response to that the target electrode-plate in the first target region receives the detecting signal, wherein the target detection capacitance value corresponding to the first target region is a capacitance value of the bending detection capacitor formed collectively by the detecting electrode-plate and the elastic conductor layer in the first target region, and the first target region is any of the at least one target region;

determining bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state; and performing a target operation based on the bending information, wherein the target operation includes at least one of a page turning operation, a screen sliding operation, a screen brightening operation or a screen darkening operation.

DETAILED DESCRIPTION OF EMBODIMENTS

In order to make principles of the present disclosure more clear, embodiments of the present disclosure will be further described in detail below with reference to the accompanying drawings.

When an OLED display screen is used as a flexible display screen, it may facilitate to an application of the OLED display screen by adding a bending recognition function into the OLED display screen. As known by the inventors, an additional sensor and a control chip are usually disposed in the OLED display screen to realize the bending recognition function of the OLED display screen. A bending recognition process includes: detecting a bending degree of a region where the sensor is located by the sensor; then sending the bending degree of the region to the control chip; and controlling the OLED display screen to realize an operation function corresponding to the bending degree of the region by the control chip according to a correspondence between the bending degree of the region and the operation function.

However, the sensor is expensive and heavy, so the bending recognition function of the OLED display screen may be implemented in a costly way, and it may not meet a demand of thinness and lightness on the OLED display screen. Moreover, when the sensor and the control chip are used to realize the bending recognition function of the OLED display screen, an accuracy of the bending recognition is low, and it is difficult to realize the bending recognition on full screen.

Figure 1:
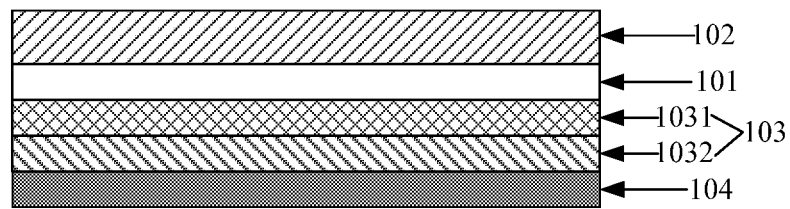
FIG. 1 is a schematic structural view of a flexible display screen according to some embodiments of the present disclosure.

FIG. 1 is a schematic structural view of a flexible display screen according to some embodiments of the present disclosure. As shown in FIG. 1, the flexible display screen includes: an array substrate 101, a light emitting device 102 on one side of the array substrate 101, and an elastic conductor layer 103 on the other side (that is, a side of the array substrate 101 distal to the light emitting device 102) of the array substrate 101.

Figure 2:
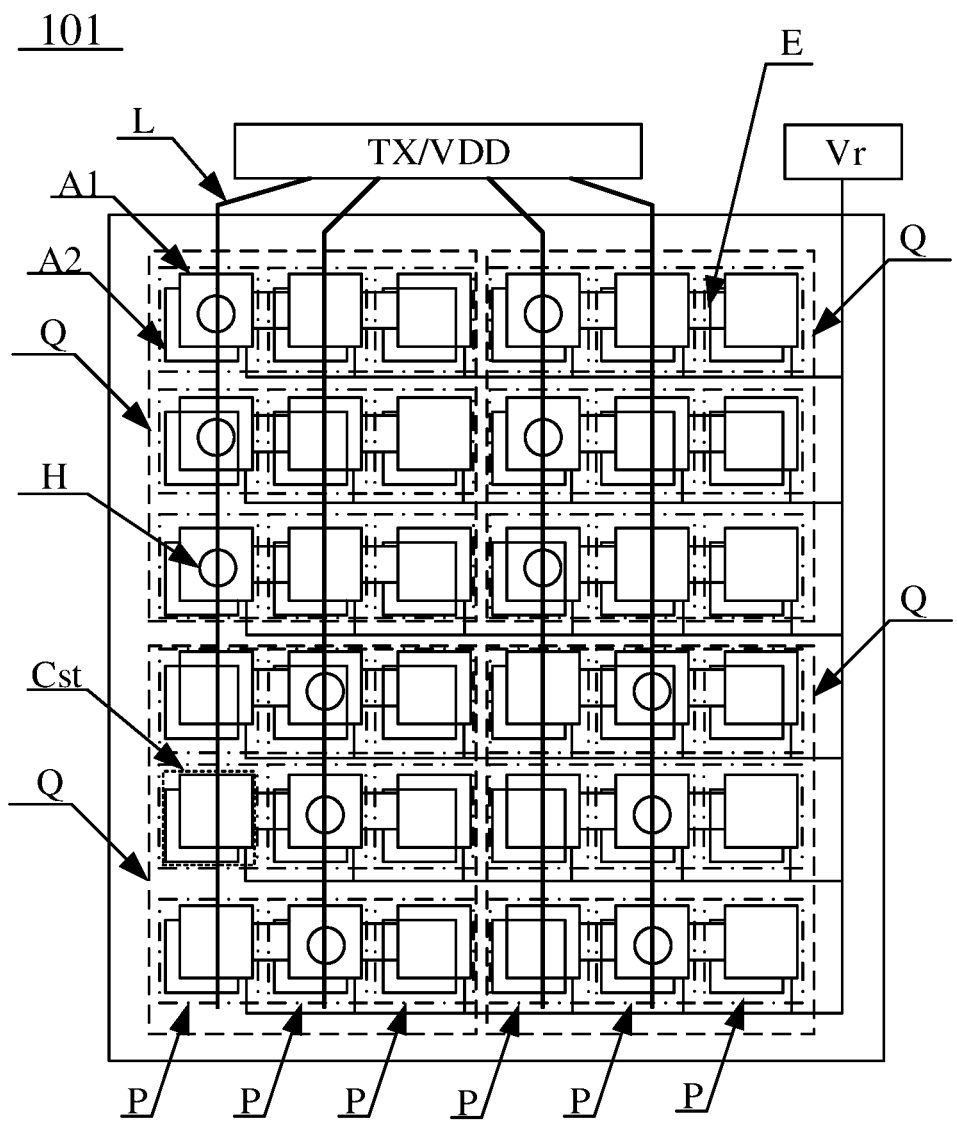
FIG. 2 is a schematic structural view of an array substrate according to some embodiments of the present disclosure.

FIG. 2 is a schematic structural view of an array substrate 101 according to some embodiments of the present disclosure. As shown in FIG. 2, the array substrate 101 has at least one (four shown in FIG. 2) target regions Q. For example, each of the target regions Q is a region enclosed by a dotted-line box. It is to be understood that the array substrate 101 may include a plurality of pixel regions P, for example, each of the pixel regions is a region enclosed by a dot-dashed-line box, and structures such as a thin film transistor, a storage capacitor, a pixel electrode and the like are provided in each of the pixel regions. For example, a storage capacitor Cst is provided in each of the pixel regions. In the embodiments of the present disclosure, one target region Q may include a plurality of pixel regions P.

Referring to FIG. 2 again, a plurality of storage capacitors Cst are provided in each of the target regions Q. Each of the storage capacitors Cst include a first electrode-plate A1 and a second electrode-plate A2. For example, both the first electrode-plate A1 and the second electrode-plate A2 are metal electrode, and the first electrode-plate A1 and the second electrode-plate A2 are opposite to and spaced apart from each other so as to form the storage capacitor Cst. It is to be understood that a medium layer may be provided between the first electrode-plate A1 and the second electrode-plate A2.

In the embodiments of the present disclosure, first electrode-plates A1 of the storage capacitors Cst in the same target region Q may constitute a target electrode-plate (which will be described in detail hereinafter). The array substrate 101 may include a detecting signal terminal TX and a detecting electrode-plate, and the detecting electrode-plate includes at least the target electrode-plate, which will be further described in detail hereinafter. The target electrode-plate is electrically connected to the detecting signal terminal TX. Referring to FIG. 1 and FIG. 2, the array substrate 101 is configured to: form a bending detection capacitor collectively by a detecting electrode-plate and the elastic conductor layer 103 in response to that the target electrode-plate receives a detecting signal from the detecting signal terminal TX.

In the flexible display screen provided by the embodiments of the present disclosure, the flexible display screen includes the array substrate and the elastic conductor layer, the plurality of storage capacitors are provided in the target region of the array substrate, and the first electrode-plates of the plurality of storage capacitors constitute the target electrode-plate which is electrically connected to the detecting signal terminal. The array substrate may be configured to form the bending detection collectively by the detecting electrode-plate and the elastic conductor layer when the target electrode-plate receives the detecting signal. Since the elastic conductor layer is highly elastic, a thickness of the elastic conductor layer may be changed significantly after it is subjected to a compressive stress, so that a distance between the detecting electrode-plate and the elastic conductor layer may be changed significantly. As a result, a capacitance value of the bending detection capacitor may also be changed significantly. Thus, it is possible to determine bending information of the target region according to the change in the capacitance value of the bending detection capacitor. In this way, it is possible to perform the bending detection on the flexible display screen without providing the additional sensor and the control chip, thereby saving the cost and meeting the demand of thinness and lightness on the flexible display screen.

Optionally, as shown in FIG. 2, the array substrate 101 includes at least one (four shown in FIG. 2) target signal lines L, and the at least one target signal line L is in one-to-one correspondence with the at least one target region Q. The target electrode-plate in each target region Q is electrically connected to the detecting signal terminal TX through the target signal line L corresponding to the target region Q, so that the target electrode-plate in each target region Q may receive the detecting signal through the corresponding target signal line L.

Figure 3:
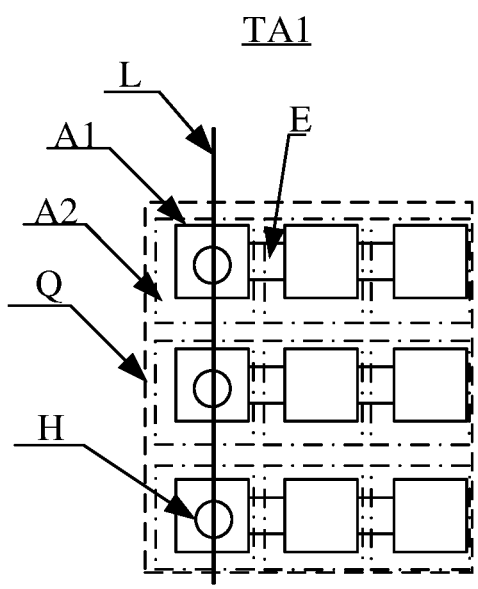
FIG. 3 is a schematic structural view of a target electrode-plate of an array substrate according to some embodiments of the present disclosure.

For example, referring to FIG. 2 and FIG. 3, in each target region Q, a plurality of storage capacitors Cst are arranged in rows and columns, that is, multiple rows of storage capacitors Cst and multiple columns of storage capacitors Cst are provided in each target region Q. In each of the multiple rows of storage capacitors Cst, the first electrode-plates A1 of the storage capacitors Cst located in the same row are electrically connected together through conductive connecting structures E. In one of the multiple columns of storage capacitors Cst, the first electrode-plates A1 of the storage capacitors Cst in the same column are electrically connected to the target signal line L, and the target signal line L is electrically connected to the detecting signal terminal TX. In this way, the first electrode-plates A1 of the storage capacitors Cst in the same target region Q are electrically connected with one another to form the target electrode-plate, which is indicated by a reference numeral TA1 in FIG. 3. In the embodiments of the present disclosure, one target region Q is provided with one target electrode-plate TA1 therein. Further, the target electrode-plate TA1 in each target region Q is electrically connected to the detecting signal terminal TX through the target signal line L corresponding to the target region Q.

For example, the connecting structures E may be conductive wires, and the target signal line L may lap on the first electrode-plate A1 through a via-hole H to be electrically connected to the first electrode-plate A1.

Optionally, as shown in FIG. 2, the array substrate 101 has a plurality of target regions Q. The target regions Q have the same shape as one another, and have an area equal to one another, and each of the target regions Q may have a rectangular shape. For example, each target region Q has a square shape, and each target region Q may have a size of 4*4 mm. The size of the target region Q may be determined according to design requirements, which is not limited in the embodiments of the present disclosure.

Figure 4:
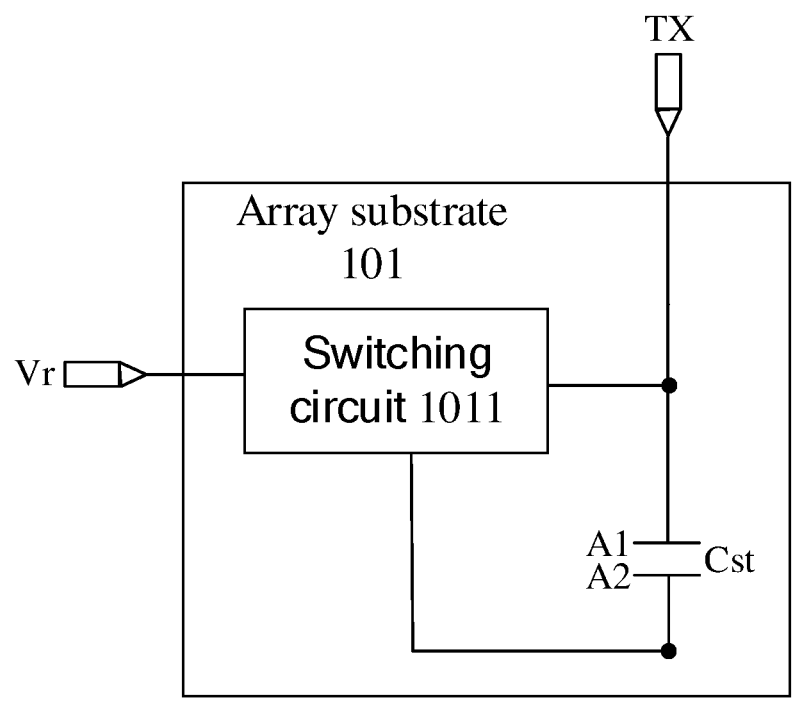
FIG. 4 is a schematic structural view of a circuit of an array substrate according to some embodiments of the present disclosure.

FIG. 4 is a schematic structural view of a circuit of an array substrate 101 according to some embodiments of the present disclosure. Referring to FIG. 4 and FIG. 2, the array substrate 101 includes a switching circuit 1011. The switching circuit 1011 is configured to: control the first electrode-plate A1 and the second electrode-plate A2 of the storage capacitor Cst in the target region Q to be in one of a connection state or a disconnection state in response to that the target electrode-plate in the target region Q receives the detecting signal from the detecting signal terminal TX, so that the electrode-plates of the storage capacitors (Cst) in the target region Q constitute the detecting electrode-plate.

Optionally, as shown in FIG. 4, the array substrate 101 may further include a switching signal terminal Vr, and the switching circuit 1011 is electrically connected to the switching signal terminal Vr. The switching circuit 1011 may be configured to: under control of a switching signal from the switching signal terminal Vr, control the first electrode-plate A1 and the second electrode-plate A2 of the storage capacitor Cst in the target region Q to be in one of the connection state or the disconnection state in response to that the target electrode-plate in the target region Q receives the detecting signal from the detecting signal terminal TX.

Optionally, the switching circuit 1011 may be configured to: control the first electrode-plate A1 and the second electrode-plate A2 of the storage capacitor Cst to be in a connection state in response to that the target electrode-plate in the target region Q receives the detecting signal, so that the target electrode-plate TA1 in the target region Q together with the second electrode-plates A2 of the storage capacitors Cst in the target region Q constitute the detecting electrode-plate, that is, the detecting electrode-plate includes the first electrode-plates A1 and the second electrode-plate A2 of the storage capacitors Cst in the target region Q.

Optionally, as for the storage capacitor Cst, an orthographic projection of the first electrode-plate A1 on the elastic conductor layer 103 may cover an orthographic projection of the second electrode-plate A2 on the elastic conductor layer 103. In such a case, the switching circuit 1011 may be configured to: control the first electrode-plate A1 and the second electrode-plate A2 of the storage capacitor Cst to be in a disconnection state in response to that the target electrode-plate in the target region Q receives the detecting signal, so that the target electrode-plate in the target region Q constitute the detecting electrode-plate. That is, in the case where the orthographic projection of the first electrode-plate A1 on the elastic conductor layer 103 covers the orthographic projection of the second electrode-plate A2 on the elastic conductor layer 103, the detecting electrode-plate may include only the target electrode-plate TA1, that is, the detecting electrode-plate and the target electrode-plate may be the same electrode-plate.

Figure 5:
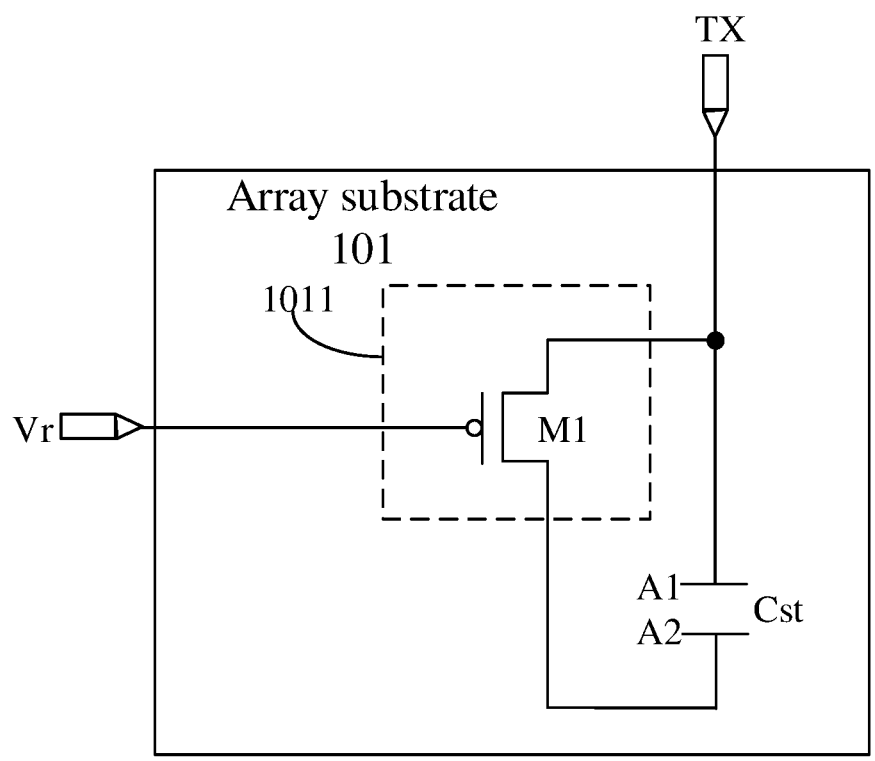
FIG. 5 is a schematic structural view of a circuit of an array substrate according to some embodiments of the present disclosure, in which an exemplary implementation of a switching circuit is shown.

Optionally, FIG. 5 is a schematic structural view of a circuit of the array substrate 101 according to the embodiments of the present disclosure, in which an exemplary implementation of the switching circuit 1011 is shown. Referring to FIG. 4, the switching circuit 1011 includes a first switching transistor M1 which includes a gate electrode, a first electrode (one of a source electrode or a drain electrode), and a second electrode (the other one of the source electrode or the drain electrode). The gate electrode of the first switching transistor M1 is electrically connected to the switching signal terminal Vr, the first electrode of the first switching transistor M1 is electrically connected to the first electrode-plate A1 of the storage capacitor Cst, and the second electrode of the first switching transistor M1 is electrically connected to the second electrode-plate A2 of the storage capacitor Cst. The switching circuit 1011 is configured to: control the first electrode-plate A1 and the second electrode-plate A2 of the storage capacitor Cst to be in one of the connection state or the disconnection state under control of the switching signal from the switching signal terminal Vr when the target electrode-plate TA1 in the target region Q receives the detecting signal from the detecting signal terminal TX. For example, when the switching signal from the switching signal terminal Vr controls the first switching transistor M1 to be in an on-state, the first electrode-plate A1 and the second electrode-plate A2 of the storage capacitor Cst are in the connection state; when the switching signal from the switching signal terminal Vr controls the first switching transistor M1 to be in an off-state, the first electrode-plate A1 and the second electrode-plate A2 of the storage capacitor Cst are in the disconnection state.

It will be readily understood by those skilled in the art that when the second electrode-plate A2 of the storage capacitor Cst is located between the first electrode-plate A1 thereof and the elastic conductor layer 103, if the orthographic projection of the first electrode-plate A1 on the elastic conductor layer 103 does not cover the orthographic projection of the second electrode-plate A2 on the elastic conductor layer 103, the second electrode-plate A2 may shield the first electrode-plate A1. In such a case, if the detecting electrode-plate includes only the target electrode-plate (which consists of the first electrode-plates A1 in the region Q), it is not beneficial to form the bending detection capacitor collectively by the detecting electrode-plate and the elastic conductor layer 103. Thus, the first electrode-plate A1 and the second electrode-plate A2 of the storage capacitor Cst may be controlled to be in the connection state, so as to electrically connect the first electrode-plate A1 with the second electrode-plate A2 of the storage capacitor Cst. As a result, the detecting electrode-plate includes the target electrode-plate and the second electrode-plates A2 of the storage capacitors Cst, so that the bending detection capacitor may be formed collectively by the detecting electrode-plate and the elastic conductor layer 103. It is also readily understood by those skilled in the art that when the second electrode-plate A2 of the storage capacitor Cst is located between the first electrode-plate A1 thereof and the elastic conductor layer 103 and the orthographic projection of the first electrode-plate A1 on the elastic conductor layer 103 covers the orthographic projection of the second electrode-plate A2 on the elastic conductor layer 103, it is also possible to control the first electrode-plate A1 and the second electrode-plate A2 of the storage capacitor Cst to be electrically connected with each other, so that the detecting electrode-plate includes the target electrode-plate and the second electrode-plates A2 of the storage capacitors Cst. Alternatively, when the orthographic projection of the first electrode-plate A1 on the elastic conductor layer 103 covers the orthographic projection of the second electrode-plate A2 on the elastic conductor layer 103, it is also possible to control the first electrode-plate A1 and the second electrode-plate A2 of the storage capacitor Cst not to be electrically connected with each other, so that the detecting electrode-plate includes only the target electrode-plate. In summary, regardless of whether the first electrode-plate A1 is shielded by the second electrode-plate A2 or not, the first electrode-plate A1 and the second electrode-plate A2 of the storage capacitor Cst may be electrically connected with each other, so that the detecting electrode-plate includes the target electrode-plate and the second electrode-plates A2 of the storage capacitors Cst; moreover, if the first electrode-plate A1 is not shielded by the second electrode-plate A2, the first electrode-plate A1 and the second electrode-plate A2 of the storage capacitor Cst may be not electrically connected with each other, so that the detecting electrode-plate includes only the target electrode-plate. The embodiments of the present application are not limited thereto.

Figure 6:
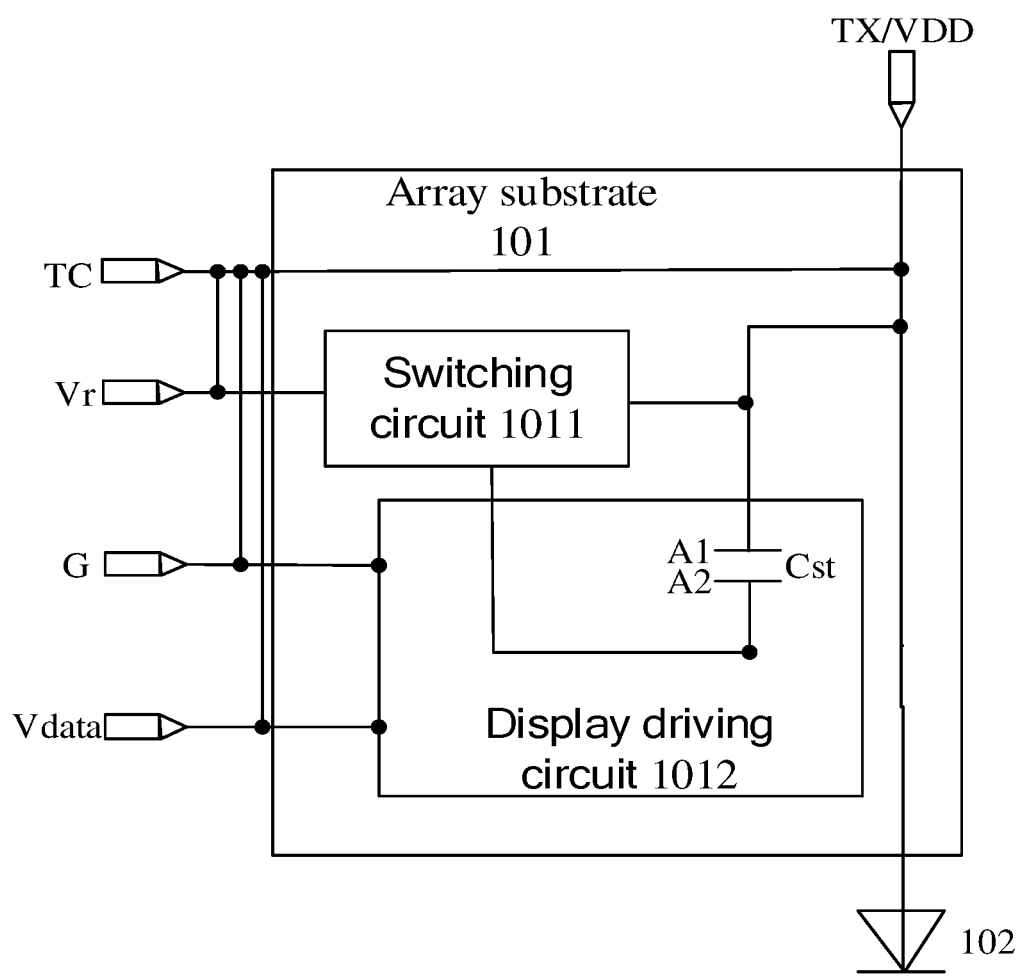
FIG. 6 is a schematic structural view of a circuit of a flexible display screen according to some embodiments of the present disclosure.

Optionally, FIG. 6 is a schematic structural view of a circuit of a flexible display screen according to some embodiments of the present disclosure. Referring to FIG. 1 to FIG. 6, on the basis of FIG. 4, the array substrate 101 further includes a display driving circuit 1012. The storage capacitor Cst is included in the display driving circuit 1012. For example, the display driving circuit 1012 includes a storage capacitor Cst. As shown in FIG. 6, the array substrate 101 further includes a power signal terminal VDD, a gate line G and a data line Vdata. The first electrode-plate A1 of the storage capacitor Cst is electrically connected to the power signal terminal VDD, and the display driving circuit 1012 is electrically connected to the gate line G, the data line Vdata and the light emitting device 102, respectively. The display driving circuit 1012 is configured to: receive a power signal through the first electrode-plate A1; charge the storage capacitor Cst through a data signal from the data line Vdata under an action of the power signal from the power signal terminal VDD and a gate driving signal from the gate line G; and supply the power signal to the light emitting device 102 under control of a voltage of the storage capacitor Cst.

Figure 7:
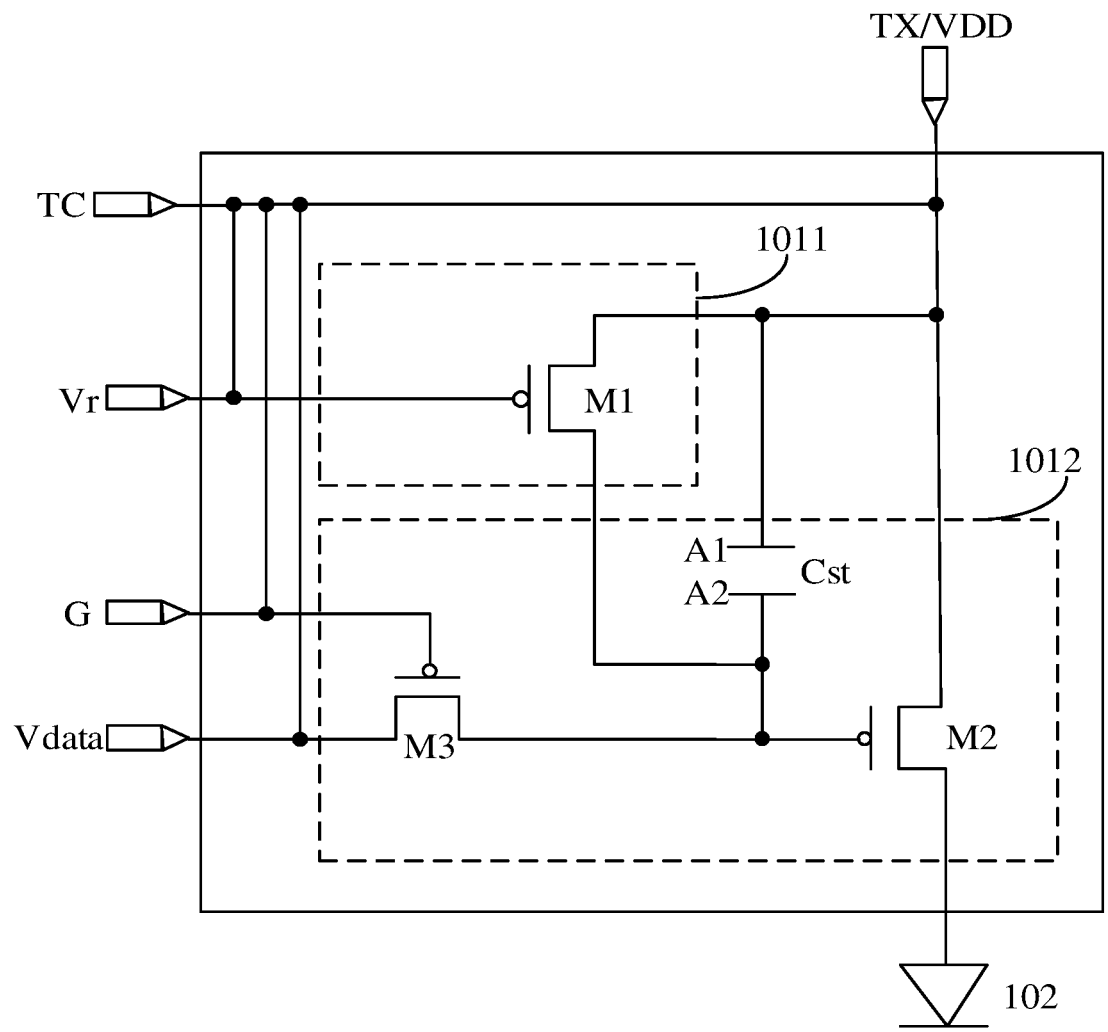
FIG. 7 is a schematic structural view of a circuit of a flexible display screen according to some embodiments of the present disclosure, in which an exemplary implementation of a switching circuit and a display driving circuit is shown.

Optionally, FIG. 7 is a schematic view of a circuit of a flexible display screen according to some embodiments of the present disclosure, in which an exemplary implementation of the switching circuit 1011 and the display driving circuit 1012 is shown. Referring to FIG. 6 and FIG. 7, the display driving circuit 1012 further includes a first driving transistor M2 and a second switching transistor M3. The first driving transistor M2 includes a gate electrode, a first electrode (one of a source electrode or a drain electrode), and a second electrode (the other one of the source electrode or the drain electrode). The second switching transistor M3 includes a gate electrode, a first electrode (one of a source electrode or a drain electrode), and a second electrode (the other one of the source electrode or the drain electrode). The gate electrode of the first driving transistor M2 is electrically connected to the second electrode-plate A2 of the storage capacitor Cst, and the first electrode of the first driving transistor M2 is electrically connected to the first electrode-plate A1 of the storage capacitor Cst, and the second electrode of the first driving transistor M2 is electrically connected to the light emitting device 102. The gate electrode of the second switching transistor M3 is electrically connected to the gate line G, the first electrode of the second switching transistor M3 is electrically connected to the data line Vdata, and the second electrode of the second switching transistor M3 is electrically connected to the gate electrode of the first driving transistor M2. For example, under the action of the gate driving signal from the gate line G, the second switching transistor M3 may be turned into an on-state so that the data signal from the data line Vdata may charge the storage capacitor Cst, and then the storage capacitor Cst may apply a stable voltage onto the gate electrode of the first driving transistor M2. In this way, the first driving transistor M2 may be turned into an on-state. Then, the power signal from the power signal terminal VDD may be supplied to the light emitting device 102 through the first driving transistor M2, so that the light emitting device 102 emits light so as to enable the flexible display screen to realize display.

Optionally, as shown in FIG. 6 and FIG. 7, the array substrate 101 further includes a time-sharing control terminal TC. The detecting signal terminal TX and the power signal terminal VDD are respectively electrically connected to the time-sharing control terminal TC. The time-sharing control terminal TC may control the detecting signal terminal TX and the power signal terminal VDD in a time-sharing manner, so that a process in which the detecting signal terminal TX supplies the detecting signal to the target electrode-plate TA1 and a process in which the power signal terminal VDD supplies the power signal to the first electrode-plate A1 of the storage capacitor Cst may be executed in a time-sharing manner. Specifically, when the time-sharing control terminal TC controls the detecting signal terminal TX to supply the detecting signal to the target electrode-plate TA1, the flexible display screen is in a bending detection state; and when the time-sharing control terminal TC controls the power signal terminal VDD to supply the power signal to the first electrode-plate A1, the flexible display is in a display state. In the embodiments of the present disclosure, since the time-sharing control terminal TC may control the detecting signal terminal TX and the power signal terminal VDD in a time-sharing manner, the bending detection process and the display process of the flexible display screen may be prevented from interfering with each other.

Optionally, the time-sharing control terminal TC may alternately control the detecting signal terminal TX and the power signal terminal VDD periodically. For example, at present, the flexible display screen displays one frame of image in duration of about 16 milliseconds. During the duration of displaying one frame of image, the time-sharing control terminal TC may alternately control the detecting signal terminal TX and the power signal terminal VDD so that the detecting signal terminal TX may supply the detecting signal of 4 milliseconds to the target electrode-plate and the power signal terminal VDD may supply the power signal of 12 milliseconds to the first electrode-plate A1 of the storage capacitor Cst. In this way, the bending detection process of the flexible display screen has less influence on the display process. Due to a smear characteristic of human eyes (the 12-millisecond display process has a smear during the 4-millisecond detection process, but 4 milliseconds is less than a response time of the human eyes to light), the bending detection process does not affect a user experience of the display process. Therefore, the flexible display screen may ensure the user experience while achieving the bending detection.

Optionally, as shown in FIG. 2, FIG. 6 and FIG. 7, the detecting signal terminal TX and the power signal terminal VDD may be the same signal terminal. The detecting signal terminal TX is electrically connected to the target electrode-plate TA1 through the target signal line L, and the power signal terminal VDD is electrically connected to the first electrode-plate A1 of the storage capacitor Cst through the target signal line L. The time-sharing control terminal TC may be electrically connected to the target signal line L so as to be electrically connected to the detecting signal terminal TX and the power signal terminal VDD, respectively.

Optionally, as shown in FIG. 6 and FIG. 7, the time-sharing control terminal TC is further electrically connected to the switching signal terminal Vr, the gate line G, and the data line Vdata, respectively, so as to control the switching signal terminal Vr while the detecting signal terminal TX is controlled to supply the detecting signal to the target electrode-plate, and to control both the gate line G and the data line Vdata while the power signal terminal VDD is controlled to supply the power signal to the first electrode-plate A1 of the storage capacitor Cst. For example, while the time-sharing control terminal TC controls the detecting signal terminal TX to supply the detecting signal to the target electrode-plate, it also controls the switching signal terminal Vr to supply the switching signal to the switching circuit 1011, so that the switching circuit 1011 controls the first electrode-plate A1 and the second electrode-plate A2 of the storage capacitor Cst to be in one of the connection state or the disconnection state. While the time-sharing control terminal TC controls the power signal terminal VDD to supply the power signal to the first electrode-plate A1 of the storage capacitor Cst, it also controls the gate line G to supply the gate driving signal to the display driving circuit 1012 and controls the data line Vdata to supply the data signal to the display driving circuit 1012, respectively.

The bending detection process and the display process of the flexible display screen provided by the embodiments of the present disclosure will be briefly described below with reference to FIG. 1 to FIG. 7.

In the bending detection process of the flexible display screen, the time-sharing control terminal TC controls the detecting signal terminal TX to supply the detecting signal to the target electrode-plate, and meanwhile it controls the switching signal terminal Vr to supply the switching signal to the gate electrode of the first switching transistor M1 so that the switching transistor M1 is turned into an on-state, and the first electrode-plate A1 and the second electrode-plate A2 of the storage capacitor Cst are in the connection state so that the target electrode-plate TA1 and the second electrode-plates A2 of the storage capacitors Cst in the target region Q constitute the detecting electrode-plate, thus the detecting electrode-plate and the elastic conductor layer 103 form the bending detection capacitor. Alternatively, the time-sharing control terminal TC controls the detecting signal terminal TX to supply the detecting signal to the target electrode-plate, and meanwhile it controls the switching signal terminal Vr to supply the switching signal to the gate electrode of the first switching transistor M1 so that the first switching transistor M1 is turned into an off-state, and the first electrode-plate A1 and the second electrode-plate A2 of the storage capacitor Cst are in the disconnection state so that the target electrode-plate TA1 constitutes the detecting electrode-plate, thus the detecting electrode-plate and the elastic conductor layer 103 form the bending detection capacitor. When the flexible display screen is in a flat state, a capacitance value of the bending detection capacitor is an initial detection capacitance value. When the flexible display screen is bent, a capacitance value of the bending detection capacitor is changed as a distance between the detecting electrode-plate and the elastic conductor layer 103 is changed, and the changed capacitance value may be the target detection capacitance value. The flexible display screen may determine bending information according to a difference between the target detection capacitance value and the initial detection capacitance value, wherein the bending information includes at least one of bending indication information, a bending degree or a bending direction, the bending indication information indicating the bending.

In the display process of the flexible display screen, the time-sharing control terminal TC controls the power signal terminal VDD to supply the power signal to the first driving transistor M2, and meanwhile it also controls the gate line G to supply the gate driving signal to the gate electrode of the second switching transistor M3 and controls the data line Vdata to supply the data signal to the first electrode of the second switching transistor M3; then the second switching transistor M3 is turned into an on-state by the gate driving signal and the storage capacitor Cst is charged by the data signal; thereafter, the storage capacitor Cst applies a stable voltage on the gate electrode of the first driving transistor M2 so that the first driving transistor M2 is turned into an on-state, in this way, the power signal is transmitted to the light emitting device 102, so that the light emitting device 102 emits light and the flexible display screen performs the display.

Those skilled in the art will readily understand that the flexible display screen usually includes a timing controller (abbreviated as TCON), the time-sharing terminal TC, the detecting signal terminal TX, the power signal terminal VDD and the switching signal terminal Vr may be signal terminals of the TCON. It will be readily understood that the bending detection process in the embodiments of the present disclosure may be performed by the TCON, and the bending detection process and the display process are controlled by the TCON in a time-sharing manner. Alternatively, a time-sharing control circuit may be provided in the flexible display screen to control the bending detection process and the display process in a time-sharing manner. In addition, the detecting signal in the embodiments of the present disclosure may be a high frequency oscillation signal, and the power signal may be a DC voltage signal. Also, the detecting signal may be a touch signal, and the bending detection capacitor may be a touch sensing capacitor, so that it is possible to achieve a touch display of the flexible display screen based on the detecting signal, which is not described in detail here.

It is also easily understood by those skilled in the art that the array substrate typically includes a pixel circuit, and both the switching circuit 1011 and the display drive circuit 1012 in the embodiments of the present disclosure may be included in the pixel circuit. In the embodiments of the present disclosure, the pixel circuit which is known to the inventors is modified (for example, adding the switching circuit 1011 to the pixel circuit which is known to the inventors, that is, adding the first switching transistor M1) and the elastic conductor layer 103 is added, so that a bending detection function of the flexible display screen is realized on the basis of realizing a display function of the flexible display screen. In the embodiments of the present disclosure, the pixel circuit which is known to the inventors is less modified without affecting preparation and performance of the light emitting device, so that the embodiments of the present disclosure can be highly realized. In addition, in the embodiments of the present disclosure, the array substrate 101 is divided into a plurality of relatively independent target regions Q, each target region Q may be used as a bending detection region, and different bending detection regions are relatively independent, so that it is possible to perform the bending detection on each target region Q separately. Thus a regional bending detection of the flexible display screen may be further realized on the basis of realizing the bending detection of the flexible display screen, thereby improving an accuracy of the bending detection of the flexible display screen.

Optionally, referring back to FIG. 1, the elastic conductor layer 103 includes a thin film elastomer layer 1031 and a thin film conductor layer 1032 which are sequentially disposed in a direction distal to the array substrate 101. The thin film elastomer layer 1031 may be an insulating layer, and the thin film conductor layer 1032 may be grounded. The bending detection capacitor may be formed between the detecting electrode-plate and the thin film conductor layer 1032. The thin film elastomer layer 1031 enables a distance between the detecting electrode-plate and the thin film conductor layer 1032 to be changed more significantly when the flexible display screen is bent, so that the capacitance value of the bending detection capacitor is changed more significantly, thereby performing the bending detection more easily.

In the embodiments of the present disclosure, the thin film conductor layer 1032 is grounded. On one hand, the thin film conductor layer 1032 and the detecting electrode-plate may form a stable bending detection capacitor. On the other hand, electric charge may be stored in a suspended (i.e., ungrounded) conductor, and an electrostatic discharge may occur as the electric charge is stored to a certain extent. If the thin film conductor layer 1032 is not grounded, the thin film conductor layer 1032 is liable to damage the flexible display screen when the electrostatic discharge occurs, for example, burning internal wires of the flexible display screen, etc. Thus, the thin film conductor layer 1032 is grounded so that static electricity in the flexible display screen may be led outside the flexible display screen through the thin film conductor layer 1032, thereby improving an antistatic interference capability of the flexible display screen and protecting the flexible display screen.

Optionally, in the embodiments of the present disclosure, the thin film elastomer layer 1031 may be made of a silicone rubber material. Since the silicone rubber material has properties of resistance to high temperature and resistance to low temperature, it is generally capable of working at −55° C., and it is capable of working for a long time at 180° C., it is still elastic for a certain duration at a temperature which is slightly more than 200° C., and it can withstand a high temperature above 300° C. instantaneously. Therefore, the thin film elastomer layer 1031 made of silicone rubber material may meet a reliability requirement of the flexible display screen. The thin film conductor layer 1032 may be made of indium tin oxide to ensure that the thin film conductor layer 1032 has advantages such as excellent electrical conductivity, light weight and anti-aging property, and to improve the antistatic interference capability of the flexible display screen. It is easily understood that the thin film conductor layer 1032 may also be a metal layer made of a metal material, which is not limited in the embodiments of the present disclosure.

Optionally, referring to FIG. 1, the flexible display screen further includes a flexible substrate 104 on a side of the elastic conductor layer 103 distal to the array substrate 101. The flexible substrate 104 may be made of polycarbonate material (abbreviated as PC), that is, the flexible substrate 104 may be a PC thin film plastic plate.

Optionally, in the embodiments of the present disclosure, the light emitting device 102 may be an electroluminescent device, for example, an OLED device or a quantum dot light emitting diode (abbreviated as QLED) device, and correspondingly, the flexible display screen may be an OLED display screen or a QLED display screen. When the flexible display screen is an OLED display screen, the light emitting device 102 may include an anode, a hole injection layer, a hole transport layer, an organic light emitting layer, an electron transport layer, an electron injection layer, a cathode and the like, which are sequentially stacked in a direction distal to the array substrate 101, and which will not be described in detail here.

According to the above descriptions, it is easily understood that the flexible display screen provided by the embodiments of the present disclosure has both the flexible display function and the bending detection function, and may also implement a touch function. The flexible display screen has rich functions and wide application scenarios. In addition, it is easily understood by those skilled in the art that the embodiments of the present disclosure only describe structures of the flexible display screen which are related to solutions of the present disclosure, and the flexible display screen may further include other structures in addition to the structures mentioned in the embodiments of the present disclosure, which will not be described in detail here.

In summary, the flexible display screen provided by the embodiments of the present disclosure includes the array substrate and the elastic conductor layer, the plurality of storage capacitors are provided in the target region of the array substrate, and the first electrode-plates of the plurality of storage capacitors constitute the target electrode-plate which is electrically connected to the detecting signal terminal. The array substrate may be configured to form the bending detection collectively by the detecting electrode-plate and the elastic conductor layer when the target electrode-plate receives the detecting signal. Since the elastic conductor layer is highly elastic, a thickness of the elastic conductor layer may be changed significantly after it is subjected to a compressive stress, so that a distance between the detecting electrode-plate and the elastic conductor layer may be changed significantly. As a result, a capacitance value of the bending detection capacitor may also be changed significantly. Thus, it is possible to determine bending information of the target region according to the change in the capacitance value of the bending detection capacitor. In this way, it is possible to perform the bending detection on the flexible display screen without providing the additional sensor and the control chip, thereby saving the cost and meeting the demand of thinness and lightness on the flexible display screen. Further, since the bending detection capacitor is provided in the flexible display screen in an entire surface manner, the accuracy of the bending recognition is high and it facilitates to realizing the bending recognition on full screen.

Figure 8:
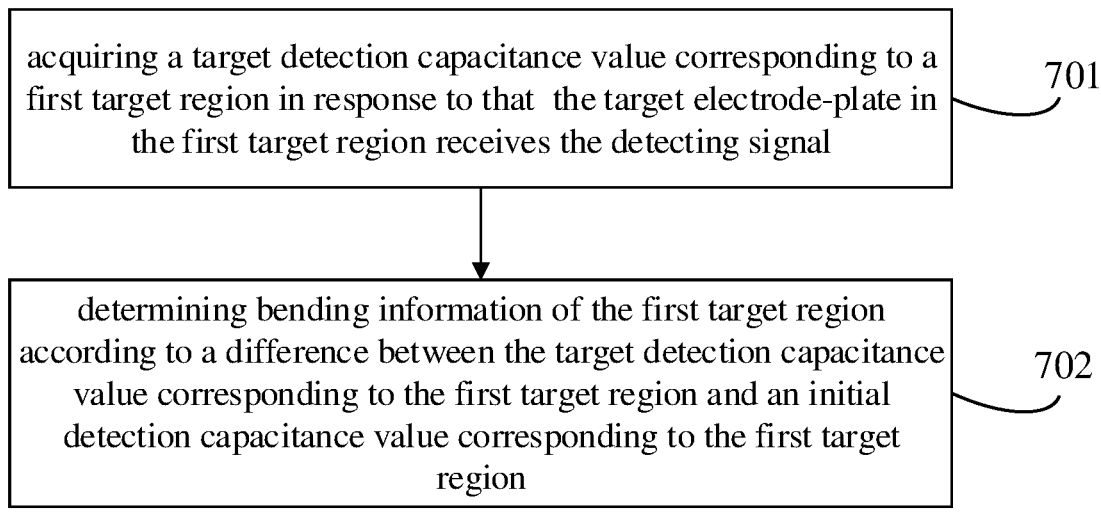
FIG. 8 is a flowchart of a bending detection method according to some embodiments of the present disclosure.

FIG. 8 is a flowchart of a bending detection method according to some embodiments of the present disclosure, which is applicable in the flexible display screen according to the above embodiments. As shown in FIG. 8, the method may include the following steps.

In step 701, a target detection capacitance value corresponding to a first target region is acquired in response to that the target electrode-plate in the first target region receives the detecting signal. The target detection capacitance value corresponding to the first target region is a capacitance value of the bending detection capacitor formed collectively by the detecting electrode-plate and the elastic conductor layer in the first target region, and the first target region is any of the target regions of the array substrate.

In step 702, bending information of the first target region is determined according to a difference between the target detection capacitance value corresponding to the first target region and an initial detection capacitance value corresponding to the first target region. The initial detection capacitance value corresponding to the first target region is a capacitance value of a capacitor formed collectively by the detecting electrode-plate and the elastic conductor layer in the first target region when the flexible display screen is in a flat state.

In summary, in the bending detection method provided by the embodiments of the present disclosure, the target detection capacitance value corresponding to the first target region is acquired when the target electrode-plate in the first target region receives the detecting signal, and the bending information of the first target region is determined according to the difference between the target detection capacitance value corresponding to the first target region and the initial detection capacitance value. It is possible to determine the bending information of the first target region according to the difference between the target detection capacitance value corresponding to the first target region and the initial detection capacitance value, so that it is possible to perform the bending detection on the flexible display screen without providing the additional sensor and the control chip, thereby saving the cost and meeting the demand of thinness and lightness on the flexible display screen.

Figure 9:
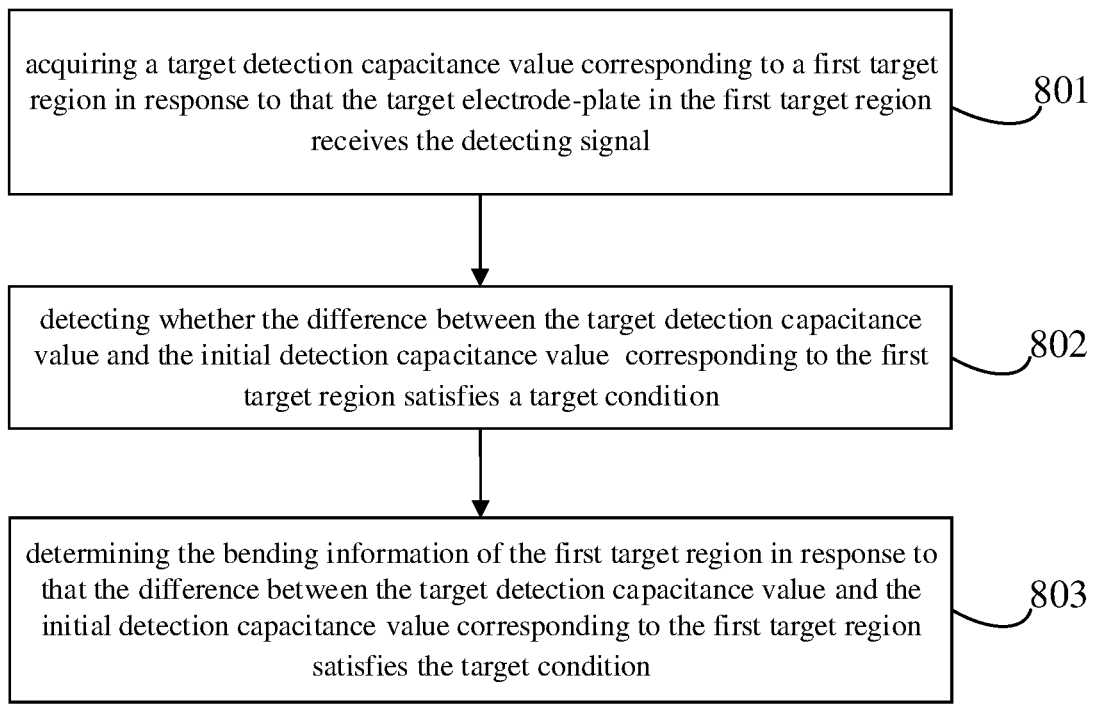
FIG. 9 is a flowchart of a bending detection method according to some embodiments of the present disclosure.

FIG. 9 is a flowchart of a bending detection method provided by some embodiments of the present disclosure, which is applicable in the flexible display screen according to the above embodiments. As shown in FIG. 9, the method may include the following steps.

In step 801, in response to that the target electrode-plate in the first target region receives the detecting signal, the target detection capacitance value corresponding to the first target region is acquired.

In the embodiments of the present disclosure, when the target electrode-plate in the first target region receives the detecting signal, the flexible display screen may acquire the target detection capacitance value corresponding to the first target region, wherein the target detection capacitance value corresponding to the first target region is a capacitance value of the bending detection formed collectively by the detecting electrode-plate and the elastic conductor layer in the first target region. The first target region is any one of the target regions of the array substrate. The target electrode-plate in the first target region consists of first electrode-plates of a plurality of storage capacitors in the first target region, and the detecting electrode-plate is the target electrode-plate. Alternatively, the detecting electrode-plate includes the target electrode-plate and the second electrode-plates of the plurality of storage capacitors in the first target region.

In the embodiments of the present disclosure, the target electrode-plate may be electrically connected to the detecting signal terminal, so that the detecting signal terminal may supply the detecting signal to the target electrode-plate. When the detecting signal terminal supplies the detecting signal, the detecting electrode-plate and the elastic conductor layer form the bending detection capacitor. Optionally, when the detecting signal terminal supplies the detecting signal, the first electrode-plate and the second electrode-plate of the storage capacitor may be in the connection state, so that the detecting electrode-plate includes the target electrode-plate and the second electrode-plates of a plurality of storage capacitors in the first target region. Optionally, if the orthographic projection of the first electrode-plate of the storage capacitor on the elastic conductor layer covers the orthographic projection of the second electrode-plate of the storage capacitor on the elastic conductor layer, the first electrode-plate and the second electrode-plate of the storage capacitor may be in the disconnection state when the detecting signal terminal supplies the detecting signal, so that the detecting electrode-plate is the target electrode-plate.

In the embodiments of the present disclosure, the target detection capacitance value C corresponding to each target region satisfies: $C=\varepsilon*S/H$, wherein $\varepsilon$ represents a dielectric constant, S represents an area of a region in which the detecting electrode-plate and the elastic conductor layer in the target region are opposite to each other, and H represents the distance between the detecting electrode-plate and the elastic conductor layer in the target region. When the detecting electrode-plate is the target electrode-plate, H represents the distance between the target electrode-plate and the elastic conductor layer. When the detecting electrode-plate includes the target electrode-plate and the second electrode-plates of the storage capacitors, H represents a distance between the elastic conductor layer and an equivalent position of the target electrode-plate and the second electrode-plates (that is, a distance between the elastic conductor layer and an equivalent position of the first electrode-plates and the second electrode-plates which are electrically connected with one another). The equivalent position of the first electrode-plates and the second electrode-plates is related to a size, a shape and the like of the first electrode-plate and the second electrode-plate, and details are not described here.

Optionally, after the flexible display screen supplies the detecting signal to the target electrode-plate in the first target region, the distance between the detecting electrode-plate and the elastic conductor layer is changed when the flexible display screen is bent, so that the capacitance value of the bending detection capacitor is changed. The changed capacitance value is the target detection capacitance value corresponding to the first target region. The change in the capacitance value causes the detecting signal to be changed, and the flexible display screen may determine the target detection capacitance value corresponding to the first target region according to the changed detecting signal.

In step 802, whether the difference between the target detection capacitance value corresponding to the first target region and the initial detection capacitance value corresponding to the first target region satisfies a target condition may be detected.

Figure 11:
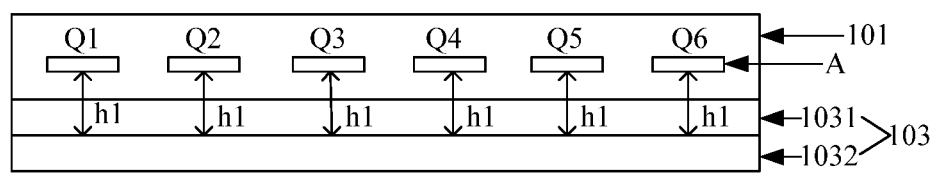
FIG. 11 is a schematic cross-sectional view of a flexible display screen according to some embodiments of the present disclosure.

Each target region may correspond to an initial detection capacitance value, and the initial detection capacitance value corresponding to each target region is a detection capacitance value corresponding to the target region when the flexible display screen is in a flat state. Therefore, the initial detection capacitance value corresponding to the first target region is a detection capacitance value corresponding to the first target region when the flexible display screen is in a flat state. It will be easily understood that the initial detection capacitance values corresponding to all target regions of the array substrate are typically equal to one another. For example, FIG. 11 is a schematic cross-sectional view of a flexible display screen provided by some embodiments of the present disclosure. As shown in FIG. 11, it is assumed that the array substrate 101 of the flexible display screen has six target regions, which are respectively labeled as Q1~Q6. When the flexible display screen is in a flat state, the distance between the elastic conductor layer 103 and the detecting electrode-plate A in each of the six target regions is h1, so that the initial detection capacitance value corresponding to each of the six target regions is equal to $\varepsilon*S/h1$.

The target condition may be, for example, that the difference between the target detection capacitance value and the initial detection capacitance value is within a target capacitance difference range, or the difference between the target detection capacitance value and the initial detection capacitance value falls into a target capacitance difference set, or the difference between the target detection capacitance value and the initial detection capacitance value is not equal to 0 (that is, the target detection capacitance value is not equal to the initial detection capacitance value). Optionally, the difference between the target detection capacitance value corresponding to the first target region and the initial detection capacitance value may be firstly determined, and then whether the difference is equal to 0 is detected so as to detect whether the difference satisfies the target condition. It will be easily understood that other manners may be employed to detect whether the difference between the target detection capacitance value and the initial detection capacitance value corresponding to the first target region satisfies the target condition, which will not be described in detail here. The target condition may be a condition that is preset in the flexible display screen. For example, the target condition may be a condition that is configured in the flexible display screen before the flexible display screen is shipped, or a condition that is configured in the flexible display screen before the bending detection method provided by the embodiments of the present disclosure is performed. A configuration time and a configuration body of the target condition are not limited in the embodiments of the present disclosure, as long as the target condition exists in the flexible display screen before the step 802 is performed.

In step 803, in response to that the difference between the target detection capacitance value corresponding to the first target region and the initial detection capacitance value corresponding to the first target region satisfies the target condition, the bending information of the first target region is determined.

Optionally, the target condition may be that the difference between the target detection capacitance value and the initial detection capacitance value is not equal to 0 (that is, the target detection capacitance value is not equal to the initial detection capacitance value). In such a case, when the difference between the target detection capacitance value and the initial detection capacitance value is not equal to 0, the bending information of the first target region may be determined. The bending information may include at least one of bending indication information, a bending degree or a bending direction, the bending indication information indicating the bending.

In the embodiments of the present disclosure, when the difference between the target detection capacitance value corresponding to the first target region and the initial detection capacitance value satisfies the target condition, determining the bending information of the first target region may include at least one of the following three possible cases.

In first possible case, when the bending information includes the bending indication information, the determining the bending information of the first target region may include determining the bending indication information of the first target region. The bending indication information may be ID-1 for indicating the bending of the flexible display screen. For example, when the difference between the target detection capacitance value corresponding to the first target region and the initial detection capacitance value is not equal to 0 (that is, when the difference between the target detection capacitance value corresponding to the first target region and the initial detection capacitance value satisfies the target condition), the bending indication information is determined as ID-1.

In second possible case, when the bending information includes the bending degree, the determining the bending information of the first target region may include determining the bending degree of the first target region according to the difference between the target detection capacitance value corresponding to the first target region and the initial detection capacitance value. Optionally, the bending degree of the first target region may be determined according to the difference between the target detection capacitance value corresponding to the first target region and the initial detection capacitance value and based on a correspondence between the difference in capacitance value and the bending degree. For example, according to the difference between the target detection capacitance value corresponding to the first target region and the initial detection capacitance value, a bending degree corresponding to the difference between the target detection capacitance value corresponding to the first target region and the initial detection capacitance value may be searched in the correspondence between the difference in capacitance value and the bending degree, then the searched bending degree is determined as the bending degree of the first target region.

Figure 12:
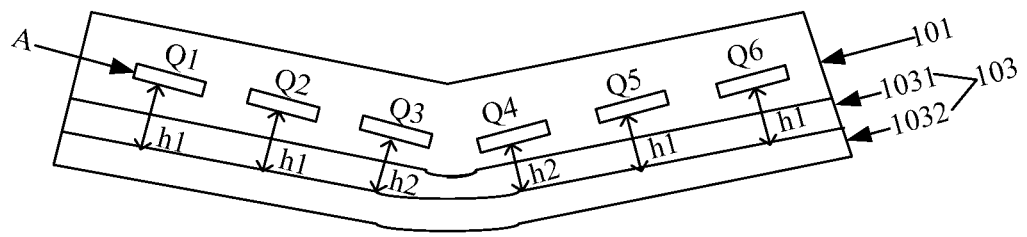
FIG. 12 is a schematic view showing the flexible display screen shown in FIG. 12 is in a bent state.

In the embodiments of the present disclosure, when the first target region is bent, a thickness of the elastic conductor layer (specifically the thin film elastomer layer) is changed after it is subjected to the compressive stress due to it is highly elastic, so that the distance between the detecting electrode-plate and the elastic conductor layer is changed, and thus the capacitance value of the bending detection capacitor corresponding to the first target region is also changed. FIG. 12 is a schematic view showing the flexible display screen shown in FIG. 11 is in a bent state. As shown in FIG. 12, when the first target region is bent, for example, when the target regions Q3 and Q4 are bent, a thickness of a part of the thin film elastomer layer 1031 corresponding to the target region Q3 and a thickness of a part of the thin film elastomer layer 1031 corresponding to the target region Q4 are both decreased, so that both the distance between the detecting electrode-plate A and the elastic conductor layer 103 in the target region Q3 and the distance between the detecting electrode-plate A and the elastic conductor layer 103 in the target region Q4 are decreased (that is, both the distance between the detecting electrode-plate A and the thin film conductor layer 1032 in the target region Q3 and the distance between the detecting electrode-plate A and the thin film conductor layer 1032 in the target region Q4 are decreased). Assuming that each of the distance between the detecting electrode-plate A and the elastic conductor layer 103 in the target region Q3 and the distance between the detecting electrode-plate A and the elastic conductor layer 103 in the target region Q4 is equal to h2, the capacitance value of the bending detection capacitor corresponding to the target region Q3 and the capacitance value of the bending detection capacitor corresponding to the target region Q4 are both £*S/h2. Since h2 is smaller than h1, the capacitance value of the bending detection capacitor corresponding to the target region Q3 and the capacitance value of the bending detection capacitor corresponding to the target region Q4 are both increased.

Figure 13:
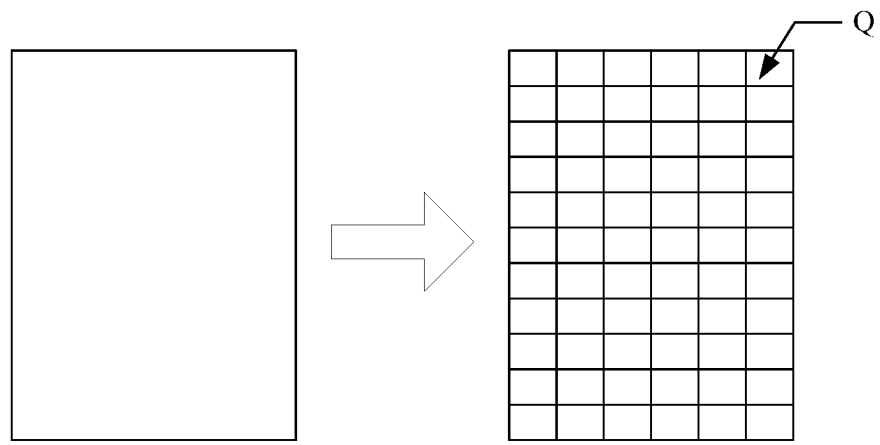
FIG. 13 is a diagram showing a correspondence between a bending degree and a capacitance value of a bending detection capacitor of a flexible display screen according to some embodiments of the present disclosure.
Figure 14:
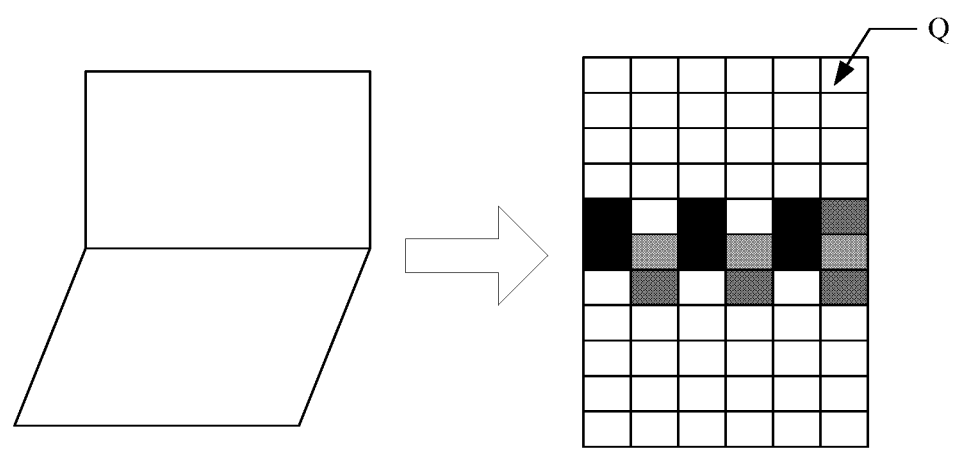
FIG. 14 is a diagram showing a correspondence between a bending degree and a capacitance value of a bending detection capacitor of a flexible display screen according to some embodiments of the present disclosure.
Figure 15:
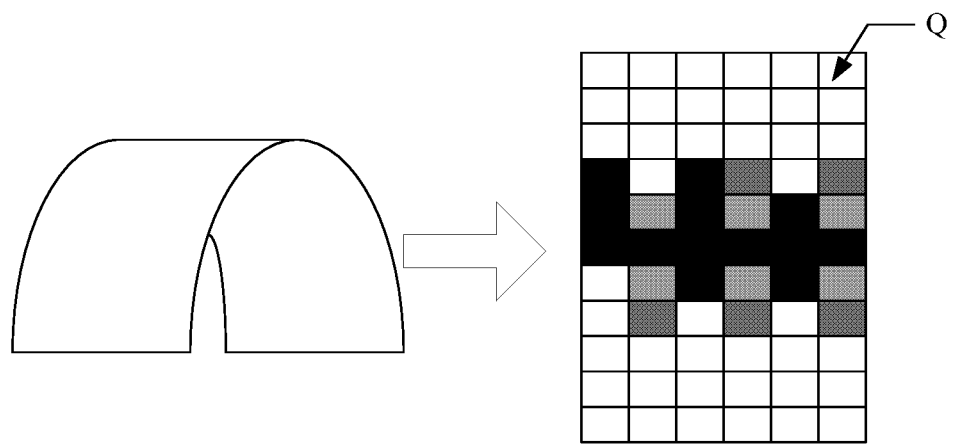
FIG. 15 is a diagram showing a correspondence between a bending degree and a capacitance value of a bending detection capacitor of a flexible display screen according to some embodiments of the present disclosure.

For example, the embodiments of the present disclosure exemplify the capacitance values of the bending detection capacitors corresponding to different bending degrees of the flexible display screen by using FIG. 13 to FIG. 15. Referring to FIG. 13 to FIG. 15, the left figure is a schematic view of the flexible display screen, and the right figure shows the capacitance values of the bending detection capacitors corresponding to the target regions Q, wherein the depth of the color in each of the target regions Q in the figure indicates the capacitance value of the corresponding bending detection capacitor. As the color becomes darker, the capacitance value becomes larger, correspondingly, the bending degree of the target region Q becomes larger. FIG. 13 shows the capacitance value of the bending detection capacitor corresponding to each of the target regions Q (that is, the initial detection capacitance value corresponding to the target region Q) in the flat state of the flexible display screen.

In third possible case, when the bending information includes the bending direction, the determining the bending information of the first target region may include determining the bending direction of the first target region. Optionally, the bending direction of the first target region may be determined according to a distribution of capacitance values of the bending detection capacitors corresponding to respective target regions of the flexible display screen. For example, a straight line connecting a plurality of target regions, which correspond to a maximum target detection capacitance value of the target detection capacitance values corresponding to respective target regions of the flexible display screen, may be determined as a bending boundary line of the flexible display screen. The bending direction of the flexible display screen may be determined according to the boundary line of the flexible display screen, and the bending direction of the first target region is generally the same as the bending direction of the flexible display screen. For example, referring to FIG. 15, a straight line connecting a row of target regions which have darkest color may be determined as a bending boundary line of the flexible display screen, and the bending direction of the flexible display screen is determined according to the bending boundary line, thereby determining the bending direction of the first target region according to the bending direction of the flexible display screen.

It can be easily understood by those skilled in the art that in the above three possible cases, the second case and the third case may be implemented on the basis of the first case. Of course, the above three cases may also be implemented independently, and the embodiments of the present disclosure are not limited thereto. In addition, in the embodiments of the present disclosure, after determining the bending information of the first target region, the flexible display screen may calculate a capacitance distribution map according to an internal algorithm, and determine a position of the first target region in the flexible display screen according to the capacitance distribution map, that is, a bending region of the flexible display screen is determined according to the capacitance distribution map.

Figure 10:
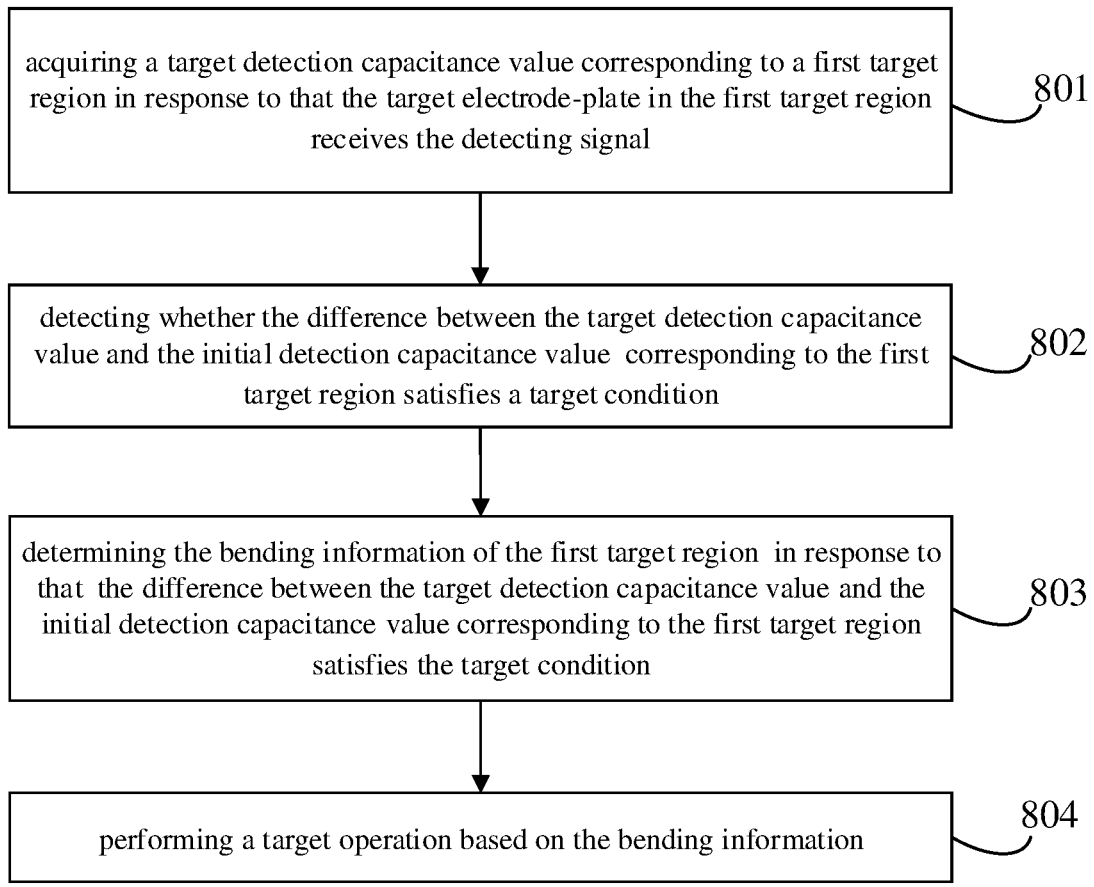
FIG. 10 is a flowchart of a driving method according to some embodiments of the present disclosure.

FIG. 10 is a flowchart of a driving method according to some embodiments of the present disclosure, which is applicable in the flexible display screen according to the above embodiments. As shown in FIG. 10, the driving method may include the above steps 701 and 702, or may include the above steps 801, 802, and 803, so as to determine the bending information of the first target region. Further, the driving method may include step 804.

In the step 804, a target operation is performed based on the bending information.

Optionally, the target operation may include at least one of a page turning operation, a screen sliding operation, a screen brightening operation or a screen darkening operation. A correspondence between the bending information and the target operation may be configured in the flexible display screen, and the flexible display screen may determine the corresponding target operation from the correspondence between the bending information and the target operation according to the bending information of the first target region determined in the step 702 or step 803, and then perform the target operation.

For the same target region, the target operations corresponding to the same bending information may be the same, and the target operations corresponding to different bending information may be different. For different target regions, the target operations corresponding to the same bending information may be the same. The embodiments of the present disclosure are not limited thereto.

Figure 16:
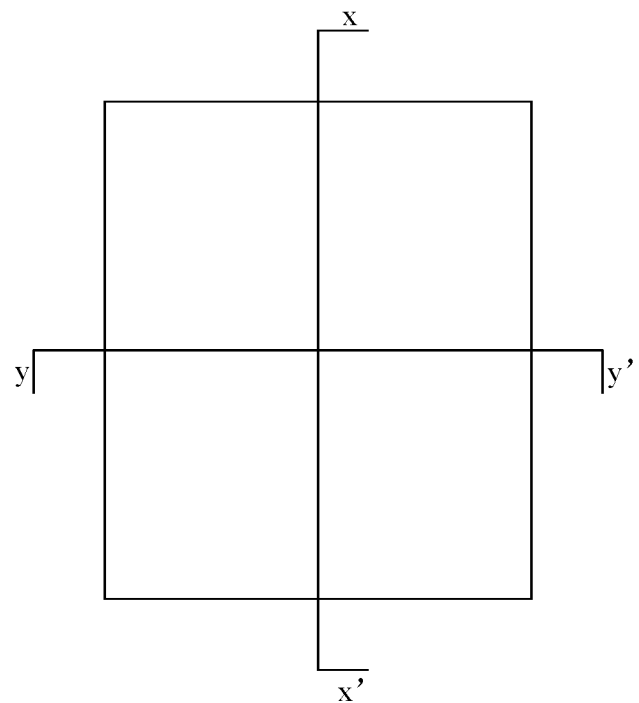
FIG. 16 is a schematic view showing bendable directions of a flexible display screen according to some embodiments of the present disclosure.

For example, FIG. 16 is a schematic view of bendable directions of a flexible display screen according to some embodiments of the present disclosure. As shown in FIG. 16, the bending degree is taken as an example of the bending information, and in a case that the bending degrees are equal, when the first target region of the flexible display screen is bent in a first direction xx', the flexible display screen performs the page turning operation, and when the first target region of the flexible display screen is bent in a second direction yy', the flexible display screen performs the screen sliding operation in up-down direction.

It is not difficult to understand from the above descriptions that in the embodiments of the present disclosure, the bending operation of the flexible display screen is a triggering operation, and the above-mentioned target operation is an operation triggered by the bending operation.

Those skilled in the art can easily understand that there may be a plurality of bent target regions at the same time, and the above steps 801 to 803 may be performed for each target region to obtain bending information of the plurality of target regions, and further, according to the bending information of the plurality of target regions, the step 804 may be performed according to the bending information of a target region which has a maximum bending degree. Alternatively, the bending information of the flexible display screen may be determined according to the bending information of the plurality of target regions, and then the step 804 is performed according to the bending information of the flexible display screen. The embodiments of the present disclosure are not described in detail here.

A sequence of the steps of the bending detection method provided by the embodiments of the present disclosure may be appropriately adjusted, and the steps may also be correspondingly increased or decreased according to the cases. Those skilled in the art can easily think of changes to the method within the technical scope disclosed in the present disclosure. These changes shall be covered by the scope of the present disclosure, and therefore will not be described in detail.

In summary, in the bending detection method provided by the embodiments of the present disclosure, the target detection capacitance value corresponding to the first target region is acquired when the target electrode-plate in the first target region receives the detecting signal, whether the difference between the target detection capacitance value corresponding to the first target region and the initial detection capacitance value satisfies the target condition may be detected, and when the difference between the target detection capacitance value corresponding to the first target region and the initial detection capacitance value satisfies the target condition, the bending information of the first target region is determined. It is possible to determine the bending information of the first target region according to the difference between the target detection capacitance value corresponding to the first target region and the initial detection capacitance value, so that it is possible to perform the bending detection on the flexible display screen without providing the additional sensor and the control chip, thereby saving the cost and meeting the demand of thinness and lightness on the flexible display screen. Further, since the bending detection capacitor is provided in the flexible display screen in an entire surface manner, the accuracy of the bending recognition is high and it facilitates to realizing the bending recognition on full screen.

Figure 17:
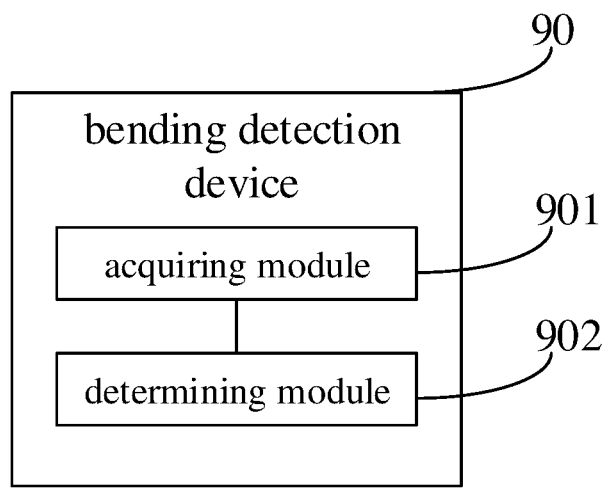
FIG. 17 is a schematic structural view of a bending detection device according to some embodiments of the present disclosure.

FIG. 17 is a schematic structural view of a bending detection device according to some embodiments of the present disclosure, which is applicable in the flexible display screen of the above embodiments. As shown in FIG. 17, the bending detection device 90 includes an acquiring module and a determining module.

The acquiring module 901 is configured to acquire a target detection capacitance value corresponding to a first target region in response to that the target electrode-plate in the first target region receives the detecting signal, wherein the target detection capacitance value corresponding to the first target region is a capacitance value of the bending detection formed collectively by the detecting electrode-plate and the elastic conductor layer in the first target region, and the first target region is any of the target regions of the array substrate.

The determining module 902 is configured to determine bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state.

In summary, in the bending detection device provided by the embodiments of the present disclosure, the target detection capacitance value corresponding to the first target region is acquired by the acquiring module when the target electrode-plate in the first target region receives the detecting signal, and the bending information of the first target region is determined by the determining module according to the difference between the target detection capacitance value corresponding to the first target region and the initial detection capacitance value. It is possible to determine the bending information of the first target region according to the difference between the target detection capacitance value corresponding to the first target region and the initial detection capacitance value, so that it is possible to perform the bending detection on the flexible display screen without providing the additional sensor and the control chip, thereby saving the cost and meeting the demand of thinness and lightness on the flexible display screen.

Optionally, the determining module 902 is further configured to: detect whether the difference between the target detection capacitance value corresponding to the first target region and the initial detection capacitance value corresponding to the first target region satisfies a target condition; and determine the bending information of the first target region when the difference between the target detection capacitance value corresponding to the first target region and the initial detection capacitance value corresponding to the first target region satisfies the target condition, wherein the bending information comprises at least one of bending indication information, a bending degree or a bending direction, and the bending indication information indicates bending.

Figure 18:
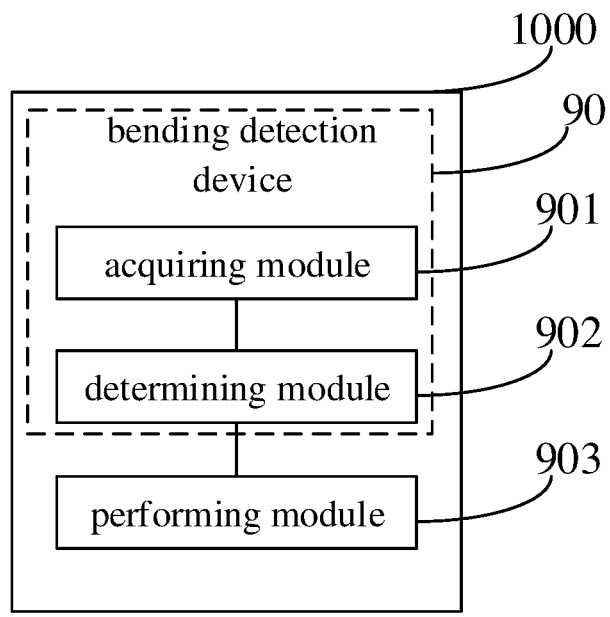
FIG. 18 is a schematic structural view of detection driving device according to some embodiments of the present disclosure.

FIG. 18 is a schematic structural view of a driving device according to some embodiments of the present disclosure, which is applicable in the flexible display screen of the above embodiments. As shown in FIG. 18, the driving device 1000 may include the bending detection device 90 as described above. Optionally, as shown in FIG. 18, the driving device 1000 may further include a performing module 903 configured to perform a target operation based on the bending information, wherein the target operation comprises at least one of a page turning operation, a screen sliding operation, a screen brightening operation or a screen darkening operation.

In summary, in the bending detection device provided by the embodiments of the present disclosure, the target detection capacitance value corresponding to the first target region is acquired by the acquiring module when the target electrode-plate in the first target region receives the detecting signal, and the bending information of the first target region is determined by the determining module according to the difference between the target detection capacitance value corresponding to the first target region and the initial detection capacitance value. It is possible to determine the bending information of the first target region according to the difference between the target detection capacitance value corresponding to the first target region and the initial detection capacitance value, so that it is possible to perform the bending detection on the flexible display screen without providing the additional sensor and the control chip, thereby saving the cost and meeting the demand of thinness and lightness on the flexible display screen. Further, since the bending detection capacitor is provided in the flexible display screen in an entire surface manner, the accuracy of the bending recognition is high and it facilitates to realizing the bending recognition on full screen.

Embodiments of the present disclosure provide a bending detection device, including a processor and a memory. The memory is configured to store a computer program. The processor is configured to execute the program stored in the memory to implement the bending detection method of the flexible display screen as shown in FIG. 8 or FIG. 9.

Embodiments of the present disclosure provide a storage medium, and when a program in the storage medium is executed by a processor, the bending detection method as shown in FIG. 8 or FIG. 9 may be implemented.

Based on the same inventive concept, some embodiments of the present disclosure provide a display device including the described-above flexible display screen and the described-above bending detection device of the flexible display screen. The display device in the embodiments of the present disclosure may be any product or component having a display function, such as a smart terminal, a mobile phone, a tablet computer, a television, a display, a notebook computer, a digital photo frame, a navigator, or a wearable device.

An expression "at least one of A or B" in the present disclosure is merely used to describe a related relationship of associated objects, indicating that there may be three relationships, for example, the expression "at least one of A or B" may indicate that three cases including that A is presented alone, B is presented alone, or A and B are both presented.

Those skilled in the art can understand that all or part of the steps implementing the above embodiments may be completed by hardware, or may be completed by hardware instructed by an associated program, and the program may be stored in a computer readable storage medium. The storage medium mentioned above may be a read only memory, a magnetic disk or an optical disk or the like. It should be noted that, functions which have been described herein as being implemented by pure hardware, software, and/or firmware may also be implemented by dedicated hardware, a combination of general-purpose hardware and software, and the like. For example, functions which have been described as being implemented by dedicated hardware (e.g., Field Programmable Gate Array (FPGA), Application Specific Integrated Circuit (ASIC), etc.) may be implemented by a combination of general-purpose hardware (e.g., central processing unit (CPU), digital signal processing (DSP) with software, and vice versa.

The above descriptions are only optional embodiments of the present disclosure, and are not intended to limit the present disclosure. Any modifications, equivalent replacements, improvements, and the like which are made within the spirit and principle of the present disclosure shall be included in the scope of the present disclosure.

What is claimed is:

1. A flexible display screen comprising:
   an array substrate comprising at least one target region, the array substrate further comprising:
   a plurality of storage capacitors in each target region, each of the storage capacitors comprising a first electrode-plate;
   a detecting signal terminal; and
   a detecting electrode-plate;
   a light emitting device on a side of the array substrate; and
   an elastic conductor layer on a side of the array substrate distal to the light emitting device,
   wherein the array substrate further comprises a target electrode-plate, the target electrode-plate comprises a plurality of first electrode-plates of the plurality of storage capacitors in the same target region, the target electrode-plate is electrically connected to the detecting signal terminal, and the detecting electrode-plate comprises at least the target electrode-plate; and
   the array substrate is configured to form a bending detection capacitor collectively by the detecting electrode-plate and the elastic conductor layer in response to that the target electrode-plate receives a detecting signal from the detecting signal terminal.

2. The flexible display screen of claim 1, wherein each of the storage capacitors further comprises a second electrode-plate, and the second electrode-plate is opposite to and spaced apart from the first electrode-plate, and
   the array substrate further comprises a switching circuit, and the switching circuit is configured to control the first electrode-plate and the second electrode-plate to be in one of a connection state or a disconnection state in response to that the target electrode-plate receives the detecting signal from the detecting signal terminal.

3. The flexible display screen of claim 2, wherein an orthographic projection of the first electrode-plate on the elastic conductor layer covers an orthographic projection of the second electrode-plate on the elastic conductor layer; and
   the switching circuit is configured to control the first electrode-plate and the second electrode-plate to be in the disconnection state in response to that the target electrode-plate receives the detecting signal from the detecting signal terminal, so that the target electrode-plate constitutes the detecting electrode-plate.

4. The flexible display screen of claim 3, wherein the second electrode-plate is on a side of the array substrate distal to the elastic conductor layer, and the first electrode-plate is on a side of the second electrode-plate distal to the elastic conductor layer.

5. The flexible display screen of claim 2, wherein the switching circuit is configured to control the first electrode-plate and the second electrode-plate to be in the connection state in response to that the target electrode-plate receives the detecting signal from the detecting signal terminal, so that the target electrode-plate together with second electrode-plates of the plurality of storage capacitors in the same target region constitute the detecting electrode-plate.

6. The flexible display screen of claim 2, wherein the array substrate further comprises a switching signal terminal;
   the switching circuit comprises a first switching transistor, the first switching transistor comprising a gate electrode, a first electrode and a second electrode;

the gate electrode of the first switching transistor is electrically connected to the switching signal terminal, the first electrode of the first switching transistor is electrically connected to the first electrode-plate, and the second electrode of the first switching transistor is electrically connected to the second electrode-plate; and the switching circuit is configured to control the first electrode-plate and the second electrode-plate to be in one of the connection state or the disconnection state under control of a switching signal from the switching signal terminal in response to that the target electrode-plate receives the detecting signal.

7. The flexible display screen of claim 6, wherein the array substrate further comprises a display driving circuit, a power signal terminal, a gate line and a data line, the display driving circuit comprises the storage capacitors, the first electrode-plate is electrically connected to the power signal terminal, and the display driving circuit is electrically connected to the gate line and the data line, respectively; and the display driving circuit is configured to receive a power signal through the first electrode-plate, charge a respective one of the storage capacitors through a data signal from the data line under an action of the power signal and a gate driving signal from the gate line, and supply the power signal to the light emitting device under control of a voltage of the respective one the storage capacitors.

8. The flexible display screen of claim 7, wherein the display driving circuit further comprises a first driving transistor and a second switching transistor, the first driving transistor comprising a gate electrode, a first electrode and a second electrode, the second switching transistor comprising a gate electrode, a first electrode and a second electrode;

the gate electrode of the first driving transistor is electrically connected to the second electrode-plate, the first electrode of the first driving transistor is electrically connected to the first electrode-plate, and the second electrode of the first driving transistor is electrically connected to the light emitting device; and the gate electrode of the second switching transistor is electrically connected to the gate line, the first electrode of the second switching transistor is electrically connected to the data line (Vdata), and the second electrode of the second switching transistor is electrically connected to the gate electrode of the first driving transistor.

9. The flexible display screen of claim 8, wherein the array substrate further comprises a time-sharing control terminal, and the detecting signal terminal and the power signal terminal are the same signal terminal electrically connected to the time-sharing control terminal.

10. The flexible display screen of claim 9, wherein the time-sharing control terminal is electrically connected to the switching signal terminal, the gate line and the data line, respectively.

11. The flexible display screen of claim 1, wherein the array substrate comprises a plurality of the target regions, the plurality of the target regions have the same shape as one another and an area equal to one another, and the shape of the target region is a rectangle.

12. The flexible display screen of claim 1, wherein the elastic conductor layer comprises a thin film elastomer layer and a thin film conductor layer which are sequentially disposed in a direction distal to the array substrate, and the thin film elastomer layer is an insulating layer.

13. The flexible display screen of claim 12, wherein the thin film conductor layer is grounded.

14. The flexible display screen of claim 1, wherein the flexible display screen further comprises a flexible substrate on a side of the elastic conductor layer distal to the array substrate.

15. A bending detection method for the flexible display screen of claim 1, the bending detection method comprising:

acquiring a target detection capacitance value corresponding to a first target region in response to that the target electrode-plate in the first target region receives the detecting signal, wherein the target detection capacitance value corresponding to the first target region is a capacitance value of the bending detection capacitor formed collectively by the detecting electrode-plate and the elastic conductor layer in the first target region, and the first target region is any of the at least one target region; and determining bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state.

16. The bending detection method of claim 15, wherein the determining bending information of the first target region according to a difference between the target detection capacitance value corresponding to the first target region and an initial detection capacitance value corresponding to the first target region comprises:

detecting whether the difference satisfies a target condition; and determining the bending information of the first target region in response to that the difference satisfies the target condition, wherein the bending information comprises at least one of bending indication information, a bending degree or a bending direction, and the bending indication information indicates bending.

17. A bending detection device comprising a processor and a memory, wherein the memory is configured to store a computer program; and the processor is configured to execute the computer program stored in the memory so as to implement the bending detection method of claim 15.

18. A non-transitory storage medium, wherein the bending detection method of claim 15 is implemented when a program in the storage medium is executed by a processor.

19. A driving method for the flexible display screen of claim 1, the driving method comprising:

acquiring a target detection capacitance value corresponding to a first target region in response to that the target electrode-plate in the first target region receives the detecting signal, wherein the target detection capacitance value corresponding to the first target region is a capacitance value of the bending detection capacitor formed collectively by the detecting electrode-plate and the elastic conductor layer in the first target region, and the first target region is any of the at least one target region;

determining bending information of the first target region according to a difference between the target detection capacitance value corresponding to the first target region and an initial detection capacitance value corresponding to the first target region, wherein the initial detection capacitance value corresponding to the first target region is a capacitance value of a capacitor formed collectively by the detecting electrode-plate and the elastic conductor layer in the first target region when the flexible display screen is in a flat state; and performing a target operation based on the bending information, wherein the target operation comprises at least one of a page turning operation, a screen sliding operation, a screen brightening operation or a screen darkening operation.

\* \* \* \* \*